United States Patent [19]
Kikuchi et al.

[11] Patent Number: 5,945,808
[45] Date of Patent: Aug. 31, 1999

[54] HYBRID ELECTRIC VEHICLE WITH BATTERY MANAGEMENT

[75] Inventors: Toshio Kikuchi, Kanagawa; Shinichiro Kitada, Tokyo; Hiroyuki Hirano, Kanagawa; Eiji Inada, Yokohama; Takeshi Aso, Kanagawa; Ryuichi Idoguchi, Yokohama; Yutaro Kaneko, Kanagawa, all of Japan

[73] Assignee: Nissan Motor Co., Ltd., Yokohama, Japan

[21] Appl. No.: 09/061,061

[22] Filed: Apr. 16, 1998

[30] Foreign Application Priority Data

Apr. 16, 1997 [JP] Japan .................................. 9-098994

[51] Int. Cl.$^6$ .................................................. H01M 10/46
[52] U.S. Cl. .................. 320/132; 320/150; 320/DIG. 21
[58] Field of Search ..................................... 320/128, 130, 320/132, 135, 144, 150, 153, DIG. 19, DIG. 21; 324/426, 427, 431

[56] References Cited

U.S. PATENT DOCUMENTS

| | | | |
|---|---|---|---|
| 5,543,703 | 8/1996 | Kusase et al. | 322/16 |
| 5,550,445 | 8/1996 | Nii | 318/153 |
| 5,608,310 | 3/1997 | Watanabe | 322/29 |
| 5,650,713 | 7/1997 | Takeuchi et al. | 322/16 |
| 5,708,352 | 1/1998 | Umeda et al. | 322/28 |

*Primary Examiner*—Edward H. Tso
*Attorney, Agent, or Firm*—Foley & Lardner

[57] ABSTRACT

A hybrid electric vehicle comprises an electric motor, a battery pack for the electric motor, a generator driven by an engine to provide electric power used for charging the battery pack, and a battery management for the battery pack. The battery management determines a current value of battery temperature (BT) of the battery pack and a current value of state of charge (SOC) within the battery pack. What are stored are a first set of varying SOC values and a second set of varying SOC values against varying BT values. The first set of varying SOC values are minimum SOC values required for the battery pack to produce a constant electric power output at varying BT values. The second set of varying SOC values are each indicative of an allowable upper limit to the quantity of electric charge that will accumulate in the battery pack due to operation of charging the battery pack with a constant electric power input at a corresponding BT value. The battery management provide an actuator command for control of electric power input upon charging the battery pack in response to the current value of BT, the current value of SOC, the first set of varying SOC values and the second set of varying SOC values.

18 Claims, 6 Drawing Sheets

HYBRID ELECTRIC VEHICLE WITH BATTERY MANAGEMENT

CROSS-REFERENCE TO RELATED APPLICATION

Reference is made of JP Patent Application Ser. No. 9-98994 filed Apr. 16, 1997, which is hereby incorporated by reference in its entirety.

FIELD OF THE INVENTION

The present invention relates to a hybrid electric vehicle and more particularly to a battery management for controlling electric power in charging a battery pack.

BACKGROUND OF THE INVENTION

Hybrid electric vehicles have a power unit, a generator, an electric motor and a battery pack. The power unit may take the form of an internal combustion engine such as a gasoline engine or a diesel engine.

Such hybrid electric vehicles may be divided into parallel hybrid electric vehicles and series hybrid electric vehicles.

In parallel hybrid electric vehicles, output of an electric motor and output of an engine are used in complementary manner or alternate manner to provide drive force to vehicle drive wheels. During regenerative braking, the motor generates output that is used to charge a battery pack.

In series hybrid electric vehicles, an electric motor provides drive force to vehicle drive wheels. An engine drives a generator whose output is used to charge a battery pack for the electric motor.

In the hybrid electric vehicles, the state of charge within the battery pack is monitored. The battery pack is charged by the output of the generator or motor until the state of charge restores to a predetermined level when the monitored state of charge drops below the predetermined level.

SUMMARY OF THE INVENTION

An object of the present invention is to provide a battery management for a hybrid electric vehicle, which provides efficient control of state of charge within a battery pack and save fuel consumed by an engine for a generator.

According to the present invention, there is provided a hybrid electric vehicle comprising: an electric motor providing drive torque to the vehicle drive wheel, a battery pack, a generator driven by an engine to provide electric power used for charging the battery pack, and a battery management.

The battery management determines a current value of battery temperature (BT) of the battery pack and a current value of state of charge (SOC) within the battery pack.

The battery management has a first set of varying SOC values and a second set of varying SOC values against varying BT values. The first set of varying SOC values are minimum SOC values required for the battery pack to produce a constant electric power output at varying BT values. The second set of varying SOC values are each indicative of an allowable upper limit to the quantity of electric charge that will accumulate in the battery pack due to operation of charging the battery pack with a constant electric power input at a corresponding BT value.

The battery management provides an actuator command for control of electric power input upon charging the battery pack in response to the current value of BT, the current value of SOC, the first set of varying SOC values and the second set of varying SOC values.

DESCRIPTION OF THE PREFERRED EMBODIMENTS

Figure 1:
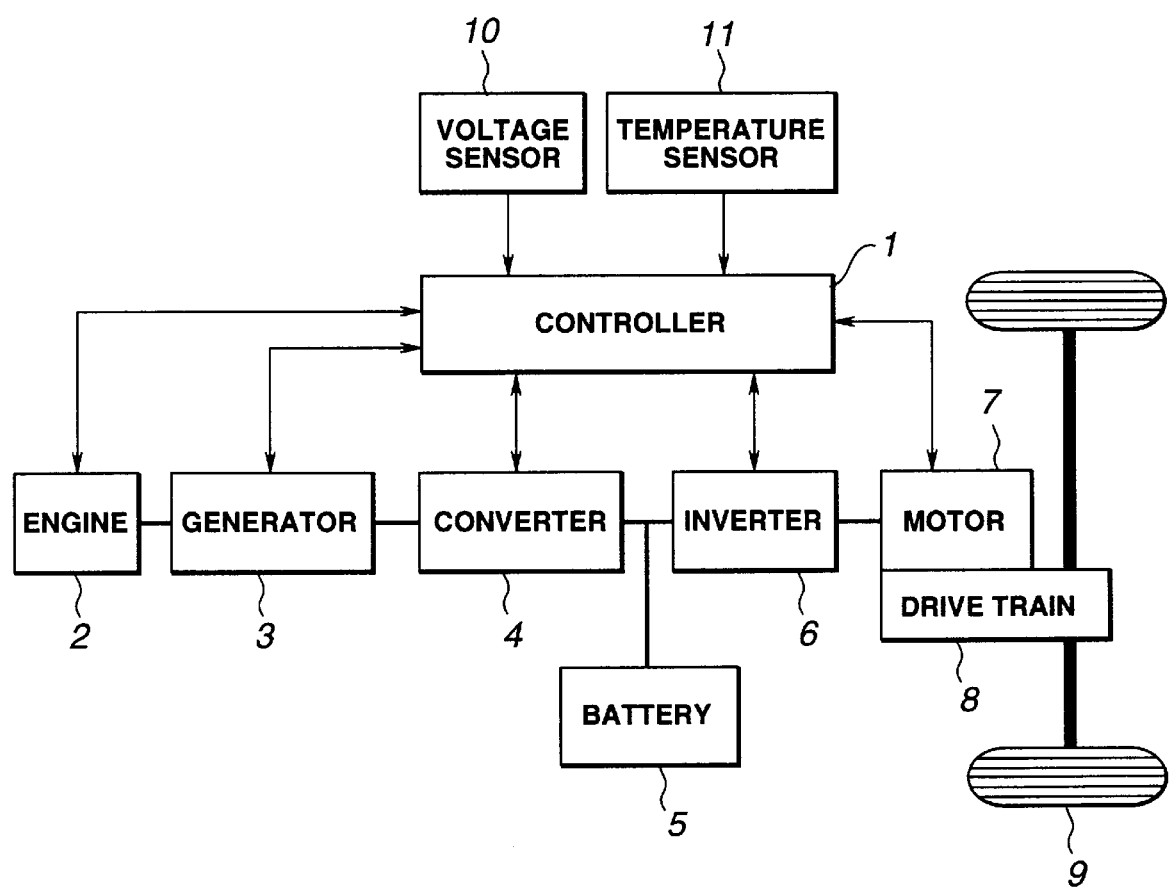
FIG. 1 illustrates schematically a hybrid electric vehicle implementing the present invention.

FIG. 1 shows a first preferred embodiment of a series hybrid electric vehicle incorporating a battery management.

Reference numeral 2 designates a power plant in the form of an engine, which provides a drive force to a generator 3. The engine 2 may take the form of an internal combustion engine, such as a gasoline engine or a diesel engine. The generator 3 may take the form of a three-phase generator that provides three-phase AC electricity. A converter 4 converts the three-phase AC electricity to DC electricity. The generator 3 may take the form of a DC generator. In this case, the converter 4 is not needed.

The DC electricity from the generator 3 is fed to a battery pack or battery 5 for charting it. DC electricity due to electrical discharge in the battery 5 is converted into AC electricity by an inverter 6. The AC electricity is fed to an alternate-current (AC) motor 7. The motor 7 is connected to a drive train 8 coupled with drive wheels 9. The motor 7 may be replaced with an induction motor or a synchronous motor or a direct-current (DC) motor. If the DC motor is used, the inverter 6 is replaced with a DC-DC converter. In this embodiment, the battery 5 is in the form of a lithium-ion battery. The battery 5 may take the form of a nickel-hydrogen battery or a lead-acid battery.

A controller 1 is provided to issue various actuator commands to the engine 2, generator 3, converter 4, inverter 6, and motor 7. A voltage sensor 10 and a temperature sensor 11 provide inputs to the controller 1. The voltage sensor 10 is provided for the controller 1 to determine a battery voltage (BV) $V_B$ of the battery 5. The temperature sensor 11 is provided for the controller 1 to determine a battery temperature (BT) $T_B$ of the battery 5.

The BV $V_B$ is a terminal voltage of a cell within a package of the battery 5 and the BT $T_B$ is an ambient temperature of the cell within a package. In the case where the battery 5 has a plurality of cells contained in its package, the voltage sensor 10 measures a terminal voltage of each cell and provides a sensor signal indicative of the measured terminal voltage. The temperature sensor 11 measures an ambient temperature around each cell and provides a sensor signal indicative of the measured ambient temperature. The controller 1 calculates the average of the sensor signals of ambient temperature and uses the result as the BT $T_B$. Similarly, it calculates the average of the sensor signals of the terminal voltage and uses the result as the BV $V_B$. Suppose the battery 5 is composed of a plurality of modules, each of which consists of a plurality of cells. In this case, the voltage sensor 10 measures a terminal voltage of each module and provides a sensor signal indicative of the measured terminal voltage. The temperature sensor 11 measures an ambient temperature of the cells within each module and provides a sensor signal indicative of the measured ambient temperature. The controller 1 calculates the average of the sensor signals of the measured terminal voltage and uses the result as the BV $V_B$. Similarly, it calculates the average of the sensor signals of the ambient temperature and uses the result as the BT $T_B$.

The controller 1 may include a digital microcomputer containing such generally-known components as a central processing unit (CPU), a read only memory (ROM), a random access memory (RAM) and an input/output interface circuit (I/O).

The CPU of the controller 1 inputs the BV $V_B$ and BT $T_B$ to determine, by arithmetic operation, a current value of SOC of the battery 5. The ROM of the controller 1 stores data as shown by the curves in FIG. 2. The CPU compares the current value of SOC with a set reference value of SOC that has been given after retrieving the data stored in the ROM and selects, in response to the comparison result, one of rules that are predetermined for the battery 5. The CPU must comply with the selected rule in executing control routines stored in the ROM for outputting a series of actuator commands addressed to the engine 2, generator 3, converter 4, inverter 6 and motor 7, respectively.

The manner of determining a current value of SOC of the battery 5 is not limited to the arithmetic operation based on the BV $V_B$ and BT $T_B$. If desired, a current value of SOC may be determined by subtracting from the maximum value of SOC the integrated value of the quantity of electric discharge.

Figure 2:
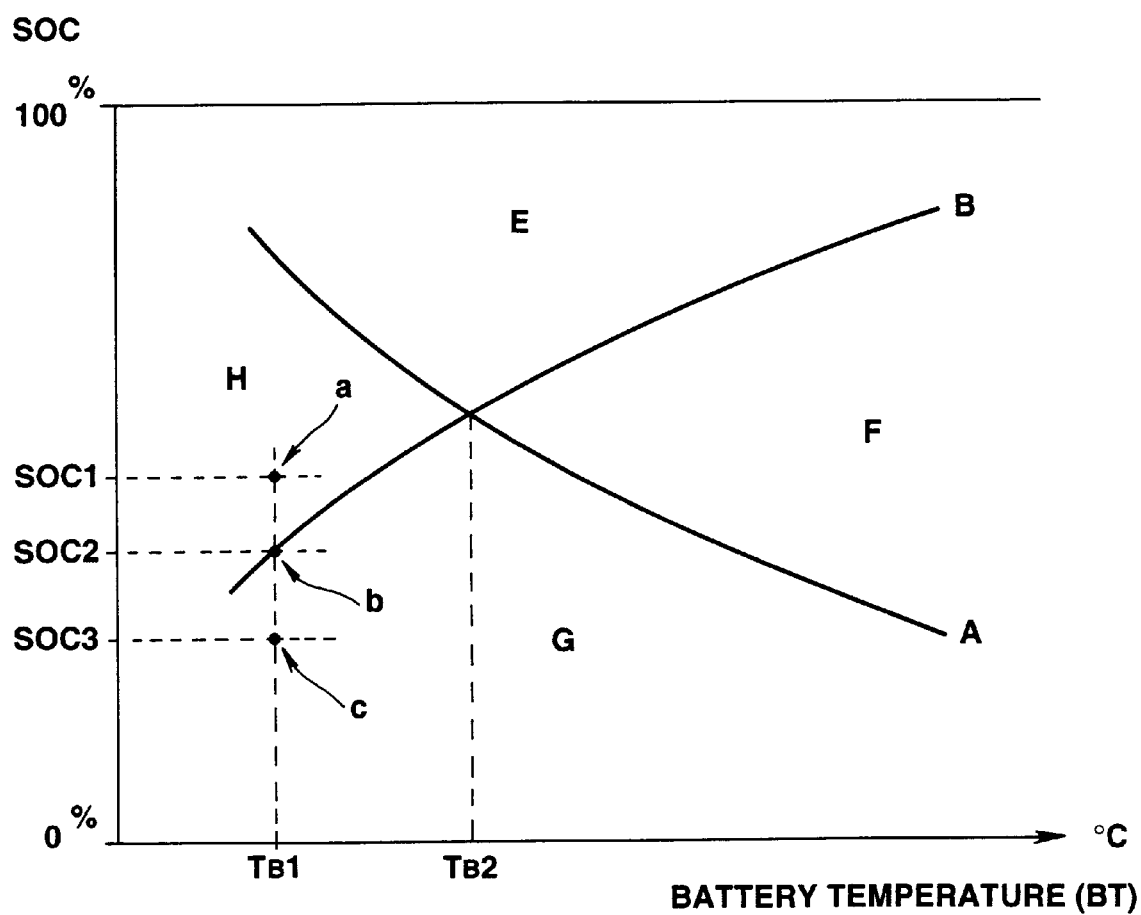
FIG. 2 graphs a constant power output (cpo) curve A and a constant power input (cpi) curve B, which illustrate SOC (state of charge) vi., BT (battery temperature) characteristics of a battery pack of the electric vehicle.

Referring to FIG. 2, the data stored in the ROM is explained. In FIG. 2, the vertical axis shows SOC expressed in terms of percentage (%) with respect to the maximum value of charge SOC. The horizontal axis shows BT $T_B$.

With the same value of SOC, the more the battery temperature $T_B$ drops, the less the battery 5 produces electric power, while, the more the battery temperature $T_B$ rises, the more the battery 5 produces electric power. For the battery 5 to produce the same electric power, the more the battery temperature $T_B$ drops, the more the state of charge SOC is required, while, the more the battery temperature $T_B$ rises, the less the SOC is required.

In FIG. 2, reference character A designates a constant power output (cpo) curve. The cpo curve A results from plotting a set of varying values of SOC against varying different values of $T_B$ over a predetermined range of the battery temperature $T_B$ that are required for the battery 5 to produce a constant electric power $P_B$ [kW]. At any given BT $T_B$, the more the SOC rises, the more the battery 5 can produce electric power. The set of varying SOC values, as represented by the cpo curve A are minimum SOC values required for the battery 5 to produce a constant electric power output at varying BT values.

Figure 3:
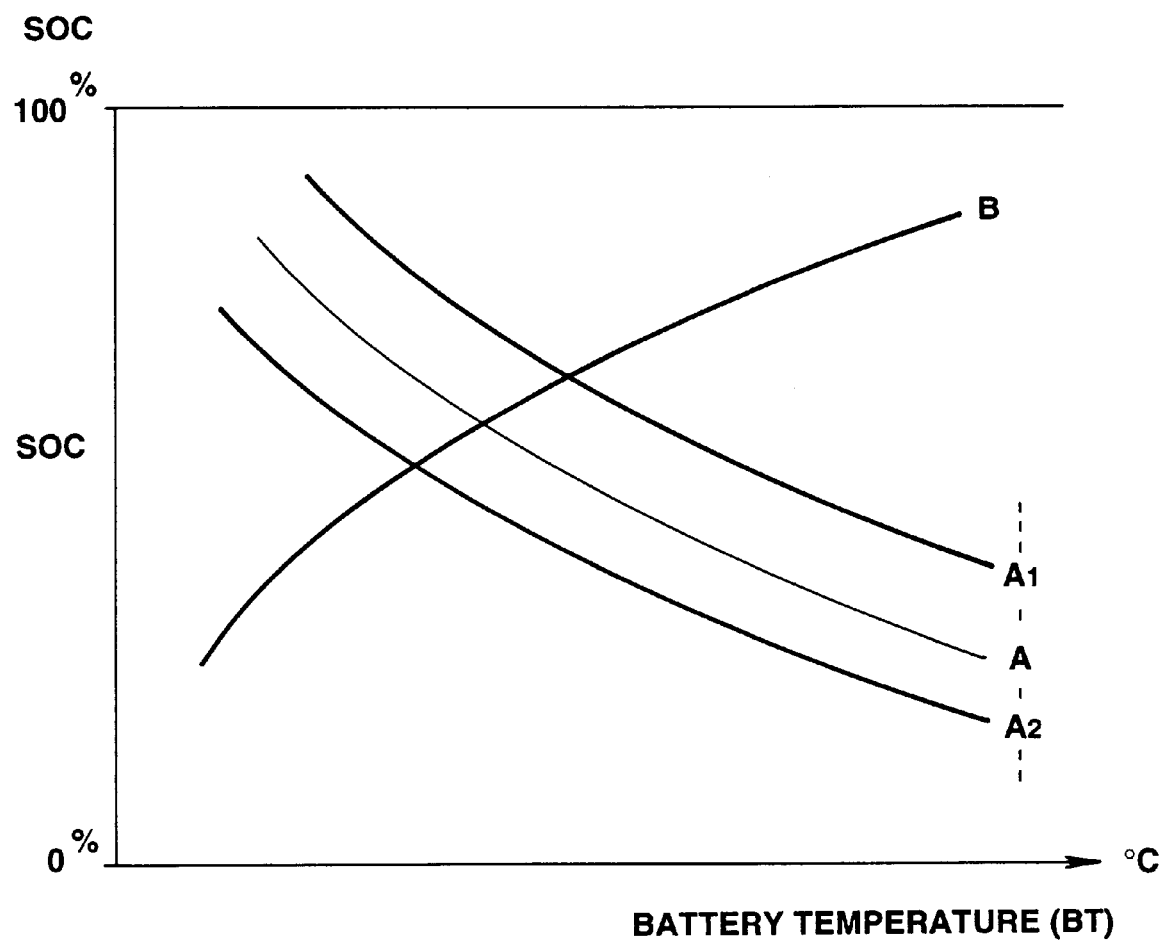
FIG. 3 graphs a family of cpi curves $A_1$, A and $A_2$.

In FIG. 3, two other cpo curves $A_1$ and $A_2$ are illustrated. The cpo curve $A_1$ shows plotting of a set of varying values of SOC against varying different values of BT $T_B$ for the battery 5 to produce electric power $P_B1$ [kW] that is higher, in magnitude, than the electric power $P_B$. The cpo curve $A_2$ shows plotting of still another set of varying values of SOC against different values of BT $T_B$ for the battery 5 to produce electric power $P_B2$ [kW] that is lower, in magnitude, than the electric power $P_B$ [kW]. Viewing in FIG. 3, the cpo curve shifts downward as the magnitude of electric power which the battery 5 can produce drops as is readily understood from the curves $A_1$, A, and $A_2$.

In FIG. 2, the reference character B designates a constant power input (cpi) curve. The cpi curve B results from plotting a set of varying values of SOC against varying values of BT $T_B$ over the predetermined range of BT $T_B$. A value on the cpi curve B is a complement of an allowable upper limit to the quantity of electric charge that will accumulate in the battery 5 if the battery 5 is charged with a predetermined constant electric power input at a selected value of BT. In this case, the maximum electric power of the generator 3 is equal to this predetermined electric power. The generator 3 is allowed to operate to charge the battery 5 with its maximum electric power when, viewing in FIG. 2, an operation point is on or below the cpi curve B. In FIG. 2, the allowable upper limit to the quantity of electric charge that will accumulate due to electric power input at point a is (100-SOC1) %. Likewise, the allowable upper limit is (100-SOC2) % at point b, and the allowable upper limit is (100-SOC3) % at point c.

In FIG. 2, the cpo curve A intersects the cpi curve B at an operation point above a battery temperature $T_B2$ to define four zones, namely, a zone E, a zone F, a zone G and a zone H. Viewing in FIG. 2, the zones E and F are disposed above the cpo curve A and the zones G and H are disposed below the curve A. The zones E and H are disposed above the cpi curve B and the zones F and G are disposed below the cpi curve B.

A magnitude of electric power that is demanded by the motor 7 could be determined in a manner, which is well known to skilled engineers engaged in power control of automotive engineering.

Suppose now that the motor 7 demands a supply of electric power as high, in magnitude, as $P_B$. The controller 1 uses the cpo curve A that is stored as data in the ROM. That is, the CPU of the controller 1 compares an operation point as defined by a current value of BT $T_B$ and a current value of SOC with the cpo curve A. When the comparison result indicates that the operation point is disposed on the cpo curve A or in one of the zones E and F above the cpo curve A, the CPU determines that the battery 5 can provide electric power as high as $P_B$. Under this condition, the controller 1 allows the battery 5 to meet the power demand $P_B$. Thus, the generator 3 does not provide any electric power to the battery 5.

When the comparison result indicates that the operation point is disposed in one of the zones G and H below the cpo curve A, the CPU determines that the battery 5 cannot provide electric power high enough to meet the electric power demand $P_B$. Under this condition, the controller 1 operates the engine 2 and the generator 3 in such a manner that the generator 2 supplies electric power high enough to meet the shortage.

Let us now consider the case where the controller 1 operates the engine 2 and generator 3 in such a manner that the generator 3 charges the battery 5. The controller 1 uses the cpi curve B that is stored as data in the ROM.

In FIG. 2, suppose that a current value of BT $T_B$ is $T_B1$, and an operation point b on the cpi curve B at this temperature $T_B1$ has a current value of SOC2 of SOC.

Let us now consider the case where a current value of the SOC is SOC1 (SOC1>SOC2) at the BT $T_B1$ as illustrated at an operation point a in FIG. 2. This operation point a is disposed in the zone H above the cpi curve B, meaning that the state of charge exceeds that (SOC2) on the cpi curve B. In this case, if the generator 3 outputs its maximum electric power for charging the battery 5, the quantity of electric charge supplied to the battery 5 becomes overabundance. This is because the quantity of electric charge that the battery 5 can store at point a is (100-SOC1) % and less than (100-SOC2) % at point b on the cpi curve B. The overabundance of electric power for charting the battery 5 leads to loss of energy. Thus, for saving fuel, the controller 1 operates the engine 2 and generator 3 in such a manner that the generator 3 will output limited amount of electric power to induce the SOC of (100-SOC1) % in the battery 5. It is well known that adjusting engine speed (rpm) of the engine 2 and excitation current of the generator 3 can vary electric power. Thus, detailed description regarding the manner of varying the electric power is hereby omitted.

Let us now consider the case where a current value of the SOC is SOC3 (SOC3<SOC2) at the temperature $T_B1$ as illustrated at an operation point c in FIG. 2. This operation point c is disposed in the zone G below the cpi curve B, meaning that the state of charge runs short of that (SOC2) on the cpi curve B. In this case, the generator 3 is allowed to output its maximum electric power to charge the battery 5. Thus, the controller 1 operates the engine 2 and the generator 3 in such a manner that the generator 3 can output its maximum electric power.

The battery management strategy described in connection with FIG. 2 is further described.

Figure 4:
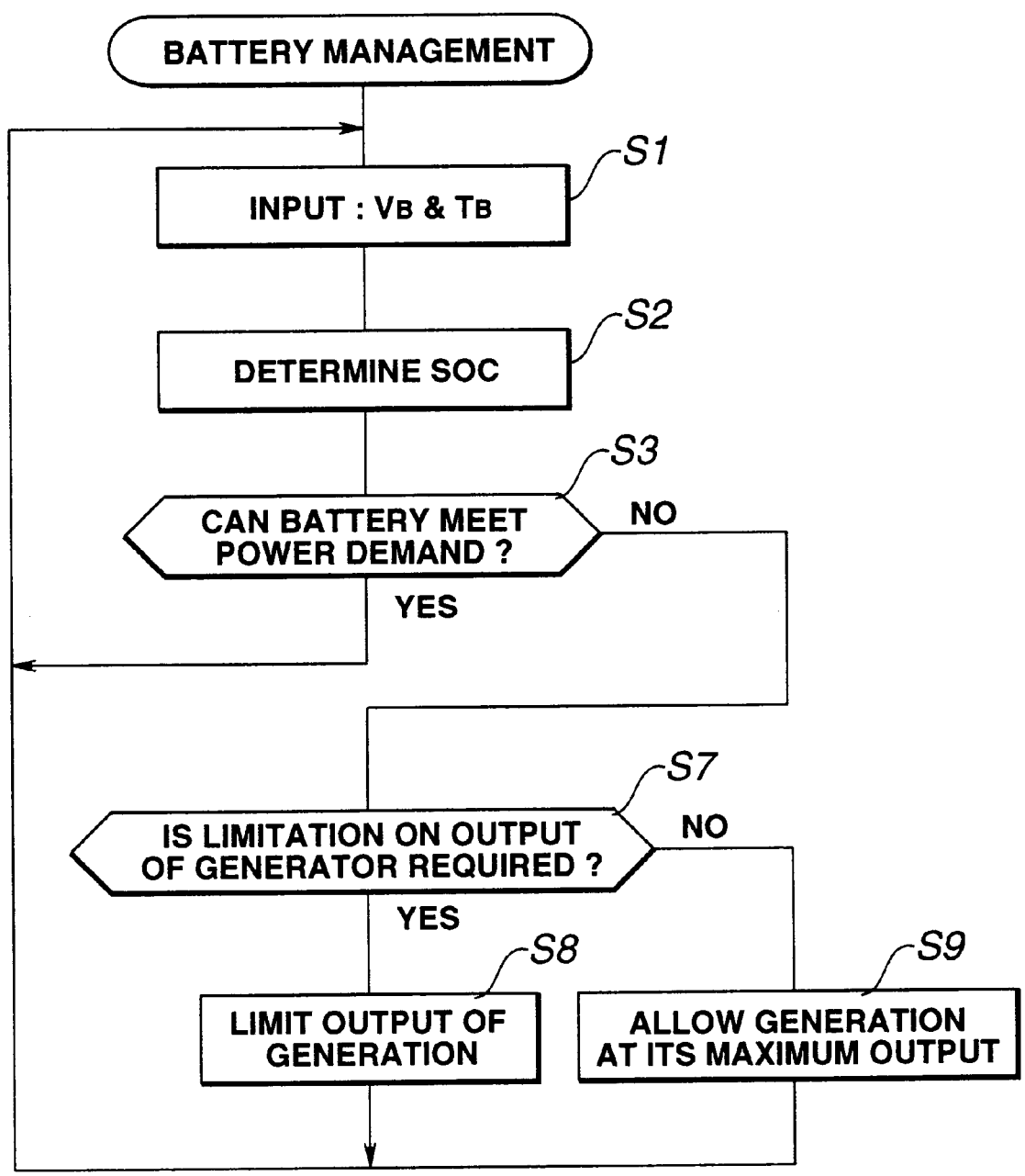
FIG. 4 illustrates a main flow routine for a microcomputer implementation of a first example of a battery management of the electric vehicle.

The flow chart in FIG. 4 illustrates a battery management routine of the preferred implementation of the present invention. The controller 1 repeats execution of this control routine at regular intervals while the engine key switch is turned on.

At step S1, the controller 1 inputs information of BV $V_B$ and BT $T_B$ of the battery 5. At the next step S2, the controller 1 determines a current value of SOC of the battery 5 based on the BV $V_B$ and the BT $T_B$.

At step S3, the controller 1 determines whether or not the battery 5 can meet electric power demand. Specifically, the controller 1 determines whether or not, viewing in FIG. 2, an operation point (SOC, $T_B$) is disposed in one of the E and F zones above the cpo curve A. If this is the case ("yes"), the routine proceeds back to step S1.

If the determination at step S3 is negative ("no"), the routine proceeds to step S7. This is the case where the operation point (SOC, $T_B$) is disposed, viewing in FIG. 2, in any one of the H and G zones below the cpo curve A, reflecting the situation that the battery 5 cannot meet the electric power demand. At step S7, the controller 1 determines whether or not, viewing in FIG. 2, the operation point (SOC, $T_B$) is disposed in the H zone above the cpi curve B. If this is the case ("yes"), the routine proceeds to step S8. In this case, the battery 5 would be shifted to electric charge overabundance state if the generator 3 outputs its maximum electric power for charging the battery 5, requiring limited output of the electric power from the generator 3. Thus, in step S8, the controller 1 generates actuator commands whereby the engine 2 and the generator 3 are operated to output a sum of electric power required for charging the battery 5 and electric power required for complementing the shortage to meet the power demand.

Suppose, viewing in FIG. 2, the operation point (SOC, $T_B$) is disposed in the G zone below the cpi curve B. If this is the case, the routine proceeds from step S7 to step S9. In this case, the battery 5 would not plunge in electric charge overabundance state even if the generator 3 outputs it maximum electric power. Thus, in step S9, the controller 1 generates actuator commands whereby the engine 2 and the generator are operated to output the maximum electric power.

From the preceding description, it will now be appreciated that supply of electric power high enough to meet varying power demand is secured over the whole operating conditions even if the battery temperature is subject to variations and the electric power which the battery is capable to output varies. This is because generation of electric power by the engine 2 and the generator 3 is controlled based on the SOC, BT $T_B$, the cpo curve A and the cpi curve B. Thus, power performance of the vehicle is maintained. Besides, even if the BT is subject to variation, the battery is charged with an appropriate amount of electric power by preventing overcharging and undercharging of the battery.

Specifically, after retrieving the cpi curve B, a reference value of SOC that corresponds to a current value of BT $T_B$ is set. When a current value of SOC is less than the set reference value of SOC, generation of maximum electric power is allowed upon charging the battery. Thus, appropriate battery charging is ensured over varying BT conditions.

Further, after retrieving the cpo curve A, a reference value of SOC that corresponds to a current value of BT $T_B$ is set. When a current value of SOC is less than the set reference value of SOC, the amount of electric power that the battery 5 is capable to output may be exceeded by the amount of electric power that is demanded. In this case, the generator 3 meets the shortage. Thus, the electric power high enough to meet the power demand is always supplied over varying BT conditions.

Figure 5:
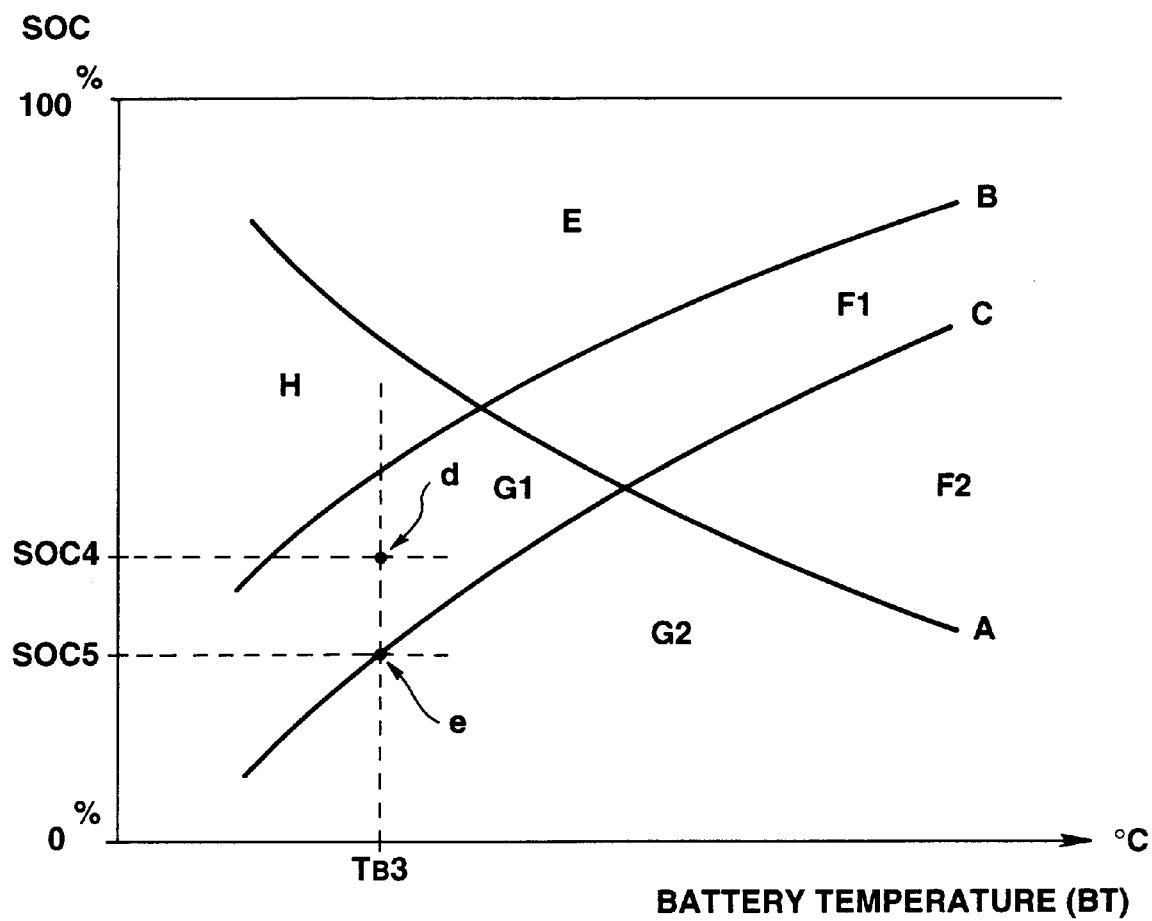
FIG. 5 graphs a cpi curve C of the battery pack of the electric vehicle.
Figure 6:
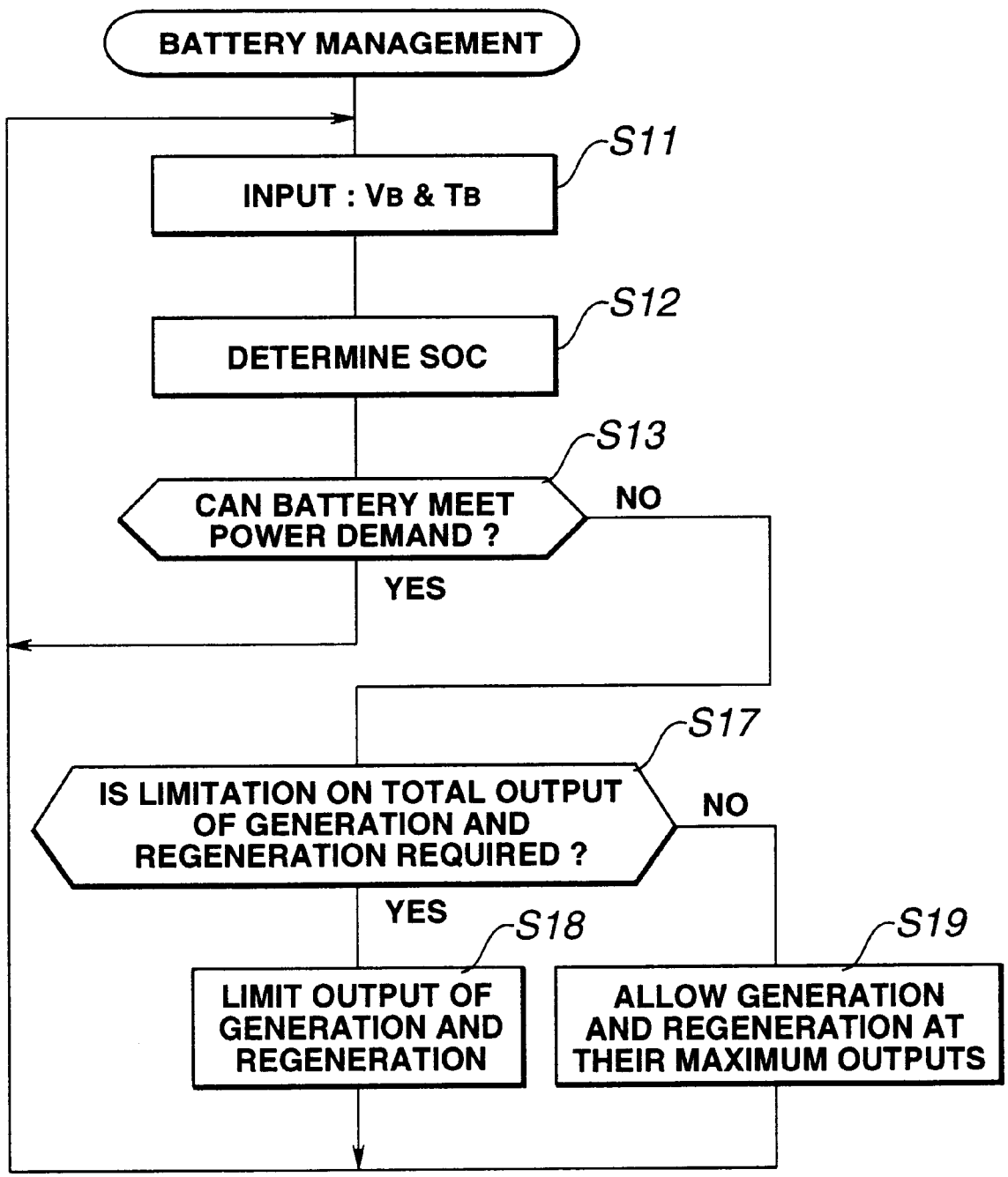
FIG. 6 illustrates a main flow routine for a microcomputer implementation of a second example of battery management of the electric vehicle.

Referring to FIGS. 5 and 6, the second embodiment according to the present invention is explained.

In an electric vehicle in which an inverter controls an electric motor, the motor acts as a generator during operation of the vehicle at deceleration or at downhill to obtain regenerative electric power. This electric power is applied via the inverter to the battery for charging it.

In this second embodiment, the charging of the battery by the regenerative electric power is taken into consideration. The second embodiment is substantially the same as the first embodiment except software.

In FIG. 5, a cpi curve C is drawn in addition to a cpi curve B and a cpo curve A that are the same the curves B and A in FIG. 2. The cpi curve C shows values of SOC against varying values of BT $T_B$. A value on the cpi curve B is a complement of an allowable upper limit to the quantity of electric charge that will accumulate in the battery 5 if the battery 5 is charged with a total of the maximum electric power by a generator 3 and the maximum regenerative electric power by a motor 7. Viewing in FIG. 5, at any given value of BT $T_B$, the length of a vertical line extending from a value of SOC=100% to the cpi curve C illustrates the allowable limit to the quantity of electric charge that will accumulate in the battery 5 is charged with the maximum electric power by generator and the maximum regenerative electric power by motor at the given valve of BT.

Suppose a current value of BT is $T_B3$ and a current value of SOC is SOC4 (%). This state is illustrated at an operation point d in FIG. 5. This operation point d is disposed in zone $G_1$ above the cpi curve C, meaning that the allowable upper limit to the electric charge that can accumulate in the battery 5 is less that on the cpi curve C. In this case, if the maximum electric power of the generator 3 and maximum regenerative electric power of the motor 7 are used to charge the battery 5, the quantity of electric charge supplied to the battery 5 becomes overabundance. The inverter 6 carries out the control of regenerative electric power in a conventional well-known manner to meet the electric power input reduction requirements.

The flow chart of FIG. 6 illustrates another battery management routine of the preferred implementation of the present invention using the data shown in FIG. 5. A controller 1 repeats execution of this control routine at regular intervals while the engine key is turned on.

At step S11, the controller 1 input information of BV $V_B$ of a battery 5 and information of BT $T_B$. At the subsequent step S12, the controller 1 determines a current value of SOC based on the input battery voltage $V_B$ and the battery temperature $T_B$. At step S13, the controller 1 determines whether or not an operation point as expressed by combination of the current value of SOC and the current value of BT $T_B$ is above the cpo curve A. What is determined in this step S13 is whether the current operation point is disposed in ranges E, F1 and F2 or in ranges H, G1 and G2 viewing in FIG. 5. In other words, the controller 1 determines whether or not the battery 5 is capable of outputting power. If the determination in step S13 shows that the battery 5 is capable of meeting the power demand, the routine proceeds to step S11. If it shows that the battery 5 cannot meet the power demand, the routine proceeds to step S17.

When, viewing in FIG. 5, the point is disposed in one of zones H, G1 and G2 that are below the cpo curve A, the battery 5 cannot afford to outputting electric power sufficiently high enough to meet the power demand. In this situation, the control routine proceeds from step S13 to step S17. In step S17, the controller 1 compares the point with the cpi curve C to determine whether or not the point is disposed in one of zones H and G1 that are above the cpi curve C. When the point is disposed in one of the zones H and G1, the battery 5 will take electric charge overabundance state if it is charged with the total of the maximum generator electric power and the maximum regenerator electric power. In this situation, the total of electric powers needs to be restrained in charging the battery 5. If as a result of determination in step S17 it has been determined that the point is disposed in one of the zones H and G1 and the total of electric powers needs to be limited, the routine proceeds to step S18. If it has been determined in step S17 that the point is not disposed in any one of zones H and G1 but it is disposed in zone G2, the routine proceeds to step S19.

When the total of generator electric power and regenerative electric power needs to be limited, the control routine proceeds to step S18. In step S18, the controller 1 determines a shortage by subtracting the current value of SOC from 100% and first electric power corresponding to this determined shortage. It determines a shortage with respect to electric power required for producing desired drive force and second electric power corresponding to this determined shortage. It also determines a sum of the first and second electric powers. It controls the engine 2, generator 3, inverter 6 and motor 7 so that they produce limited electric power adjusted to the sum.

When, viewing in FIG. 5, the point is disposed in zone G2 below the cpi curve C, charging the battery 5 with maximum generator electric power of the generator and maximum regenerative electric power will not cause electric charge overabundance state. In this situation, the control routine proceeds to step S19. In step S19, the controller 1 controls the engine 2, generator 3, inverter 6 and motor 7 so that the generator 3 operates to produce its maximum electric power and the motor 7 operates to generate its maximum regenerative electric power.

From the preceding description, it is understood that generation of electric power by the engine and generator and regenerative electric power by the motor and inverter are controlled based on state of charge SOC of the battery 5, BT $T_B$, cpo curve A, and cpi curve C. This ensures stable supply of electric power high enough to produce desired driving force even if electric power that the battery 5 can produce varies, maintaining good vehicle performance.

Besides, the battery 5 can be charged without any overcharging or undercharging over variations in BT. Thus, the battery 5 can be always charged to an appropriate level.

Using the cpi curve C, a value of SOC corresponding to a current value of BT $T_B$ is set. This set value of SOC is compared with a current value of SOC. When the current value of SOC is less than the set value of SOC, the maximum electric power is generated and the maximum electric power is regenerated. Thus, the battery 5 is charged to the appropriate level over various values of BT $T_B$.

Using the cpo curve A, a value of SOC corresponding to a current value of BT $T_B$ is set. This set value of SOC is compared with a current value of SOC. When the current value of SOC is less than the set value of SOC, electric power is generated to compensate for a shortage of electric power, which the battery 5 cannot afford to. Thus, supply of electric power high enough to produce desired driving force is ensured even if electric power that the battery 5 can supply varies with variations of BT $T_B$. Thus, drive performance of the vehicle is maintained.

According to the second embodiment, the total of electric power by the generator and electric power by the motor during regenerative mode is limited in charging the battery if any limitation on electric power is needed to prevent overcharging of the battery. As is well known, the motor cannot generate electric power except during operation in regenerative mode when the vehicle travels at deceleration or downhill. In this situation, first of all, the electric power from the motor may be limited when the battery is to be charged with limited electric power. If the electric power remains overabundance when the electric power from the motor is suppressed to zero, the electric power from the generator may be limited too.

Explaining specifically in connection with FIG. 5, when the operation point is disposed in the zone G1, the electric power by the motor is limited and the electric power by the generator is unlimited. When the operation point is disposed in the zone H, the electric power by the motor is suppressed to zero and the electric power by the generator is limited.

For saving fuel, first of all, electric power by the generator may be limited when the battery is to be charged with limited electric power. If the electric power remains overabundance when the electric power from the generator is suppressed to zero, the electric power from the motor may be limited too.

In the preceding description, the present invention is implemented in the electric vehicle of the type known as a series hybrid electric vehicle. The present invention may be implemented in a parallel hybrid electric vehicle.

In the embodiments, the battery takes the form of lithium ion battery. The form of the battery is not limited to this type.

What is claimed is:

1. A hybrid electric vehicle comprising: an electric motor providing drive torque to the vehicle drive wheel, a battery pack as a source of electric power to the electric motor, a generator driven by an engine to provide electric power used for charging the battery pack, and a battery management for the battery pack, the battery management which is operative to determine a current value of battery temperature (BT) of the battery pack and a current value of state of charge (SOC) within the battery pack;

the battery management having a fist set of varying SOC values and a second set of varying SOC values against varying BT values, said first set of varying SOC values being minimum SOC values required for the battery pack to produce a constant electric power output at varying BT values, said second set of Varying SOC values being each indicative of an allowable upper limit to the quantity of electric charge that will accumulate in the battery pack due to operation of charging the battery pack with a constant electric power input at a corresponding BT value; and the battery management being operative to provide an actuator command for control of electric power input upon charging the battery pack in response to said current value of BT, said current value of SOC, said first set of varying SOC values and said second set of varying SOC values.

2. An electric vehicle as claimed in claim 1, wherein the battery management is operative to compare said current value of SOC with a first reference value of SOC that has been set after referring to said first set of varying SOC values with said current value of BT; and the battery management is operative in response to the result of said comparison of said current value of SOC with said first reference value of SOC to provide said actuator command when said current value of SOC is less than said first reference value of SOC.

3. An electric vehicle as claimed in claim 2, wherein the battery management is operative to compare said current value of SOC with a second reference value of SOC that has been set after referring to said second set of varying SOC values with said current value of BT;

the battery management is operative in response to the result of said comparison of said current value of SOC with said second reference value of SOC when said current value of SOC is less than said first reference value to provide said actuator command that allows charging of the battery pack with electric power as high as said constant electric power input when said current value of SOC is less than said second reference value of SOC.

4. An electric vehicle as claimed in claim 2, wherein the battery management is operative to compare said current value of SOC with a second reference value of SOC that has been set after referring to said second set of varying SOC values with said current value of BT;

the battery management is operative in response to the result of said comparison of said current value of SOC with said second reference value of SOC when said current value of SOC is less than said first reference value of SOC to provide said actuator command that limits electric power below said constant electric power input when said current value of SOC is not less than said second reference value of SOC.

5. An electric vehicle as claimed in claim 3, wherein the battery management is operative in response to the result of said comparison of said current value of SOC with said second reference value of SOC when said current value of SOC is less than said first reference value of SOC to provide said actuator command that limits electric power below said constant electric power input when said current value of SOC is not less than said second reference value of SOC.

6. An electric vehicle as claimed in claim 1, wherein said constant electric power input is as high as maximum electric power that the generator can output.

7. An electric vehicle as claimed in claim 6, wherein the battery management is operative to compare said current value of SOC with a first reference value of SOC that has been set after referring to said first set of varying SOC values with said current value of BT; and the battery management is operative in response to the result of said comparison of said current value of SOC with said first reference value of SOC to provide said actuator command when said current value of SOC is less than said first reference value of SOC.

8. An electric vehicle as claimed in claim 7, wherein the battery management is operative to compare said current value of SOC with a second reference value of SOC that has been set after referring to said second set of varying SOC values with said current value of BT;

the battery management is operative in response to the result of said comparison of said current value of SOC with said second reference value of SOC when said current value of SOC is less than said first reference value to provide said actuator command that allows charging of the battery pack with the maximum electric power of the generator.

9. An electric vehicle as claimed in claim 7, wherein the battery management is operative to compare said current value of SOC with a second reference value of SOC that has been set after referring to said second set of varying SOC values with said current value of BT;

the battery management is operative in response to the result of said comparison of said current value of SOC with said second reference value of SOC when said current value of SOC is less than said first reference value of SOC to provide said actuator command that limits electric power of said generator below said constant electric power input when said current value of SOC is not less than said second reference value of SOC.

10. An electric vehicle as claimed in claim 8, wherein the battery management is operative in response to the result of said comparison of said current value of SOC with said second reference value of SOC when said current value of SOC is less than said first reference value of SOC to provide said actuator command that limits electric power of said generator below said constant electric power input when said current value of SOC is not less than said second reference value of SOC.

11. An electric power as claimed in claim 1, wherein said constant electric power input is as high as the total of maximum electric power that the generator can output and maximum electric power that the electric motor can generate during regenerative operation.

12. An electric vehicle as claimed in claim 11, wherein the battery management is operative to compare said current value of SOC with a first reference value of SOC that has been set after referring to said first set of varying SOC values with said current value of BT; and the battery management is operative in response to the result of said comparison of said current value of SOC with said first reference value of SOC to provide said actuator command when said current value of SOC is less than said first reference value of SOC.

13. An electric vehicle as claimed in claim 12, wherein the battery management is operative to compare said current value of SOC with a second reference value of SOC that has been set after referring to said second set of varying SOC values with said current value of BT;

the battery management is operative in response to the result of said comparison of said current value of SOC with said second reference value of SOC when said current value of SOC is less than said first reference value to provide said actuator command that allows charging of the battery pack with the total of the maximum electric powers.

14. An electric vehicle as claimed in claim 12, wherein the battery management is operative to compare said current value of SOC with a second reference value of SOC that has been set after referring to said second set of varying SOC values with said current value of BT;

the battery management is operative in response to the result of said comparison of said current value of SOC with said second reference value of SOC when said current value of SOC is less than said first reference value of SOC to provide said actuator command that limits the total of electric power of said generator and electric power said motor during regenerative operation below said constant electric power input when said current value of SOC is not less than said second reference value of SOC.

15. An electric vehicle as claimed in claim 13, wherein the battery management is operative in response to the result of said comparison of said current value of SOC with said second reference value of SOC when said current value of SOC is less than said first reference value of SOC to provide said actuator command that limits the total of electric power of said generator and electric power of said electric motor during regenerative operation below said constant electric power input when said current value of SOC is not less than said second reference value of SOC.

16. An electric vehicle as claimed in claim 1, wherein the battery management comprises:

a temperature sensor measuring ambient temperature around each of cells within the battery pack and providing a first sensor signal indicative of said measured ambient temperature;

a voltage sensor measuring a terminal voltage of each of cells within the battery pack and providing a second sensor signal indicative of said measured terminal voltage; and a controller coupled with said temperature sensor and said voltage sensor, said controller being operative to calculate the average of said first sensor signals to give the result as the current value of said battery temperature, said controller being operative to calculate the average of said second sensor signals to give the result as the current value of BT, said controller being operative to perform arithmetic operation based on the current value of BT and the current value of said battery voltage.

17. An electric vehicle as claimed in claim 16, wherein said battery management comprises:

a converter operatively coupled with the generator and the battery pack to convert output of the generator to direct-current (DC) electricity.

18. A method for management of a battery pack as a source of electric power for an electric motor of a hybrid electric vehicle including a generator driven by an engine to provide electric power used for charging the battery pack, the method comprising the steps of:

determining a current value of battery temperature (BT) of the battery pack;

determining a current value of state of charge (SOC) within the battery pack;

preparing a first set of varying SOC values and a second set of varying SOC values against varying BT values, said first set of varying SOC values being minimum SOC values required for the battery pack to produce a constant electric power output at varying BT values, said second set of varying SOC values being each indicative of an allowable upper limit to the quantity of electric charge that will accumulate due to operation of charging the battery pack with a constant electric power input at a corresponding BT value; and providing an actuator command for control of electric power input upon charging the battery pack in response to said current value of BT, said current value of SOC, said first set of varying SOC values and said second set of varying SOC values.

* * * * *